United States Patent [19]

Yagi

[11] Patent Number: 4,667,270

[45] Date of Patent: May 19, 1987

[54] LIGHT EMITTING DIODE HOLDER

[75] Inventor: Masaru Yagi, Tsushima, Japan

[73] Assignee: Kitagawa Industries Co., Ltd., Nagoya, Japan

[21] Appl. No.: 755,584

[22] Filed: Jul. 16, 1985

[30] Foreign Application Priority Data

Oct. 31, 1984 [JP] Japan ............................ 59-165196[U]

[51] Int. Cl.$^4$ .............................................. H05K 7/12
[52] U.S. Cl. .................... 361/380; 361/400; 361/417; 361/419; 361/420; 339/91 R
[58] Field of Search ...................... 248/27.1; 339/17 C, 339/17 D, 91 F, 91 L, 91 R; 361/380, 400, 403, 413, 417–420

[56] References Cited

U.S. PATENT DOCUMENTS

| | | | |
|---|---|---|---|
| 3,543,220 | 6/1968 | Jones | 339/91 L |
| 3,569,909 | 3/1971 | Garver | 339/91 R |

FOREIGN PATENT DOCUMENTS

| | | | |
|---|---|---|---|
| 2718442 | 11/1978 | Fed. Rep. of Germany | 361/400 |
| 2747272 | 4/1979 | Fed. Rep. of Germany | 361/400 |
| 0644116 | 10/1950 | United Kingdom . | |
| 0913534 | 12/1962 | United Kingdom | 361/380 |
| 0995324 | 6/1965 | United Kingdom . | |
| 1012870 | 12/1965 | United Kingdom . | |
| 1055631 | 1/1967 | United Kingdom . | |
| 1440370 | 6/1976 | United Kingdom . | |

*Primary Examiner*—A. D. Pellinen
*Assistant Examiner*—Gregory D. Thompson
*Attorney, Agent, or Firm*—Oblon, Fisher, Spivak, McClelland, & Maier

[57] ABSTRACT

Described herein is a light emitting diode holder, including a seat block with lead wire holes widened toward the top surface of the block, and confronting pairs of gripper arms on opposite sides of the seat block and provided with locking projections at the upper ends thereof. The LED holder permits insertion of external lead wires of a light emitting diode in sockets on a circuit board, and is capable of securely holding a light emitting portion of the diode in position. Fixation of a light emitting diode on the holder can be confirmed by a click sound from the gripper arms.

8 Claims, 8 Drawing Figures

LIGHT EMITTING DIODE HOLDER

BACKGROUND OF THE INVENTION

1. Field of the Invention

This invention relates to an LED holder for fixing a light emitting diode (hereinafter referred to as "LED" for brevity). More particularly, among various types of LED which are currently in use, the invention concerns a holder which is particularly suitable for LED with a light emitting portion sealed in a round-head cylindrical case of a transparent synthetic resin material.

2. Description of the Prior Art

For LED of this sort, there have been used holders 18 (see FIG. 7) which are centrally provided with small through holes 22 to pass external lead wires 20 of LED 10 therethrough and with a circular recess 24 formed around the small holes to nest a collar portion 12 of LED therein. The LED 10 has a transparent cylindrical case 16 including a rounded head 14.

The LED holder of this type, however, has drawbacks in that the LED has to be moved back and forth to probe the position of the sockets of the external lead wires on the circuit board and in that it is difficult to retain correctly in a predetermined position the light emitting portion of the LED which is simply nested in the recess after insertion of the external lead wires in the sockets and which is therefore easily dislocated after fixation, coming off the socket in some cases.

SUMMARY OF THE INVENTION

Accordingly, it is an object of the present invention to solve the above-mentioned drawbacks of the conventional LED holders, more particularly, to provide a LED holder which facilitates insertion of the external lead wires of a LED in the sockets provided in a circuit board and which can fix the light emitting portion securely in a correct position.

It is another object of the present invention to provide an LED holder which permits one to confirm fixation of a LED easily by a click sound.

Still another object of the invention is to provide an LED holder which can prevent mutual interference of LED devices which are mounted in adjacent positions.

According to the present invention, there is provided a LED holder which includes a seat block for mounting a light emitting portion of a LED; and a pair uprising gripper arms integrally formed on opposite sides of the seat block; a pair of lead wire holes formed in the seat block and widened in a conical shape toward the top side of the seat block; and locking projections formed at the upper ends of the gripper arms for locking engagement with a flange portion of the LED.

The LED holder according to the invention, which is provided with a pair of upwardly widened lead wire holes in the seat block for the light emitting portion of a LED, permits one to pass the external lead wires of the LED through the lead wire holes in an extremely facilitated manner. The locking projections which are provided at the upper ends of the gripper arms on opposite sides of the seat block securely fix the LED in position by engagement with a flange portion of the LED. The gripper arms are flexed away from each other by abutting engagement of the flange portion of the LED with the locking projections when the LED is pushed downward to place it on the seat block, facilitating setting the light emitting portion of the LED on the seat block. Further, once the LED is set on the seat block, the locking projections of the gripper arms are located on the flange portion of the LED, holding the LED securely in position by inward restoring forces of the outwardly flexed gripper arms.

The above and other objects, features and advantages of the invention will become apparent from the following description and the appended claims, taken in conjunction with the accompanying drawings which show by way of example some preferred embodiments of the invention.

BRIEF DESCRIPTION OF THE DRAWINGS

In the accompanying drawings:

FIG. 6 is a perspective view of still another embodiment of the invention; and.

DESCRIPTION OF PREFERRED EMBODIMENTS

Figure 1:
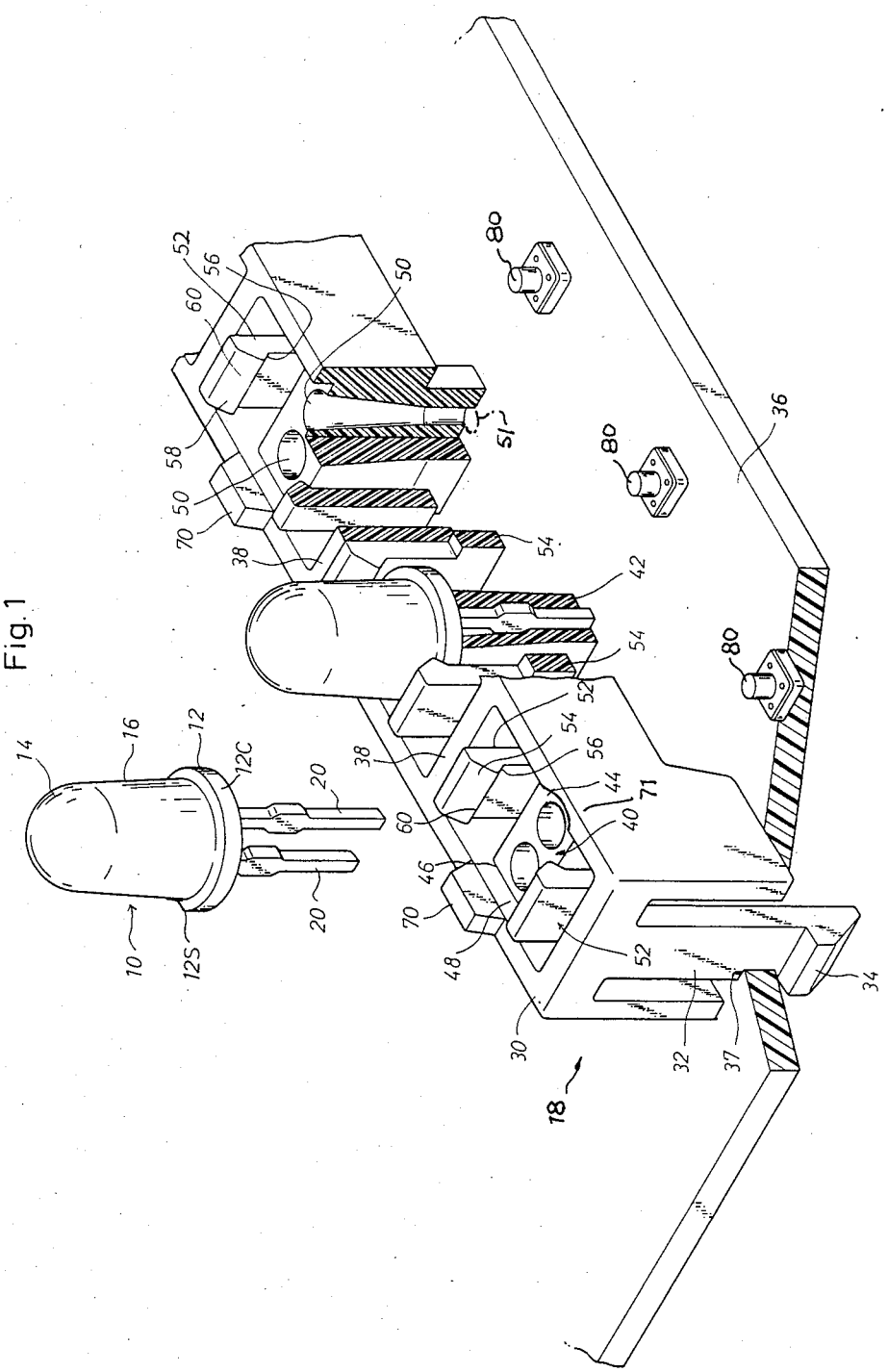
FIG. 1 is a partly cutaway perspective view of an LED holder embodying the present invention.
Figure 2:
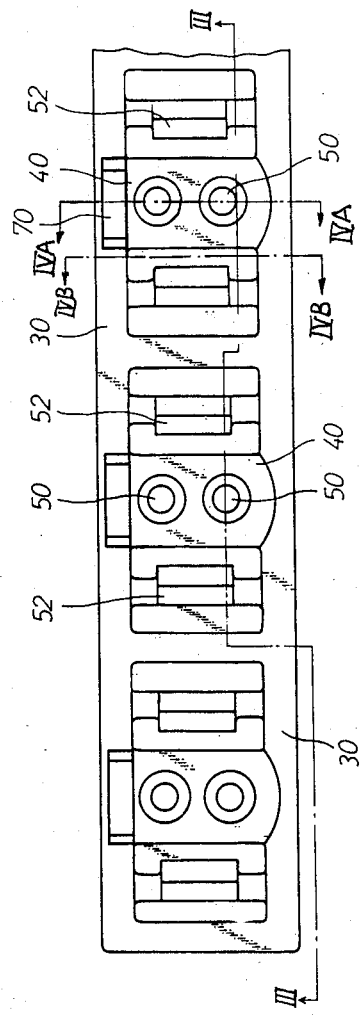
FIG. 2 is a plan view of the LED holder of FIG. 1.

Hereafter, the invention is described more particularly by way of preferred embodiments shown in the drawings.

Figure 3:
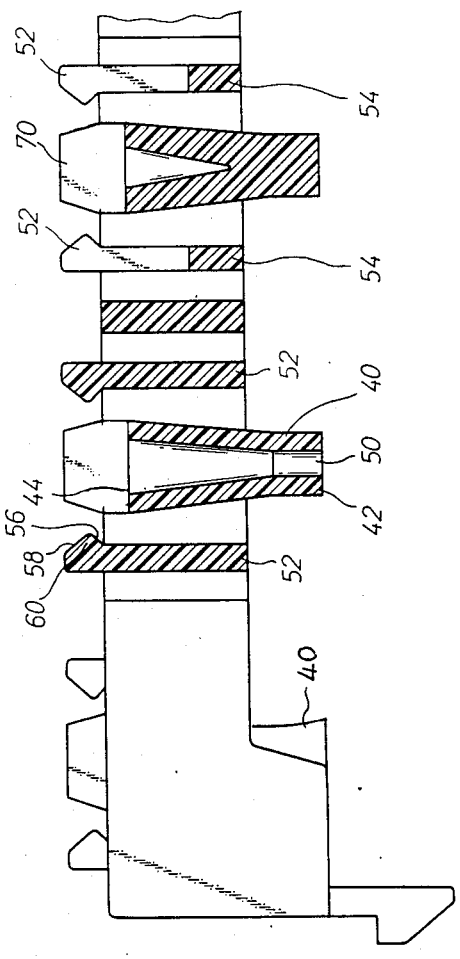
FIG. 3 is a sectional view taken on line III—III of FIG. 2.
Figure 4A:
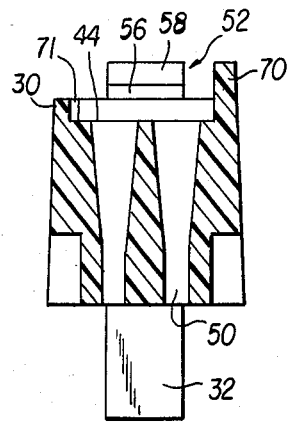
FIG. 4A is a sectional view taken on line IVA—IVA of FIG. 2.
Figure 4B:
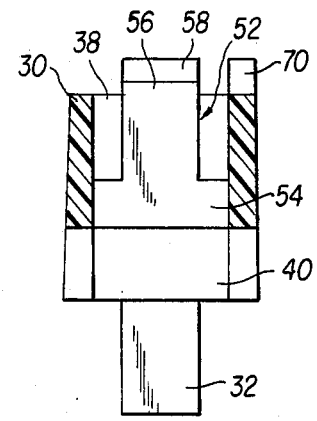
FIG. 4B is a sectional view taken on line IVB—IVB of FIG. 2.
Figure 5:
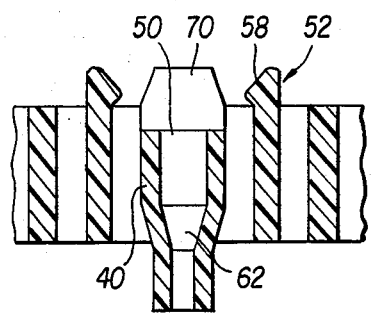
FIG. 5 is a sectional view of another embodiment of the invention.

Referring to FIGS. 1–4B, there is illustrated a LED holder of the first embodiment of the invention in a partly cutaway perspective view, wherein the holder 18 includes an outer frame 30 of an elongated box-like shape for holding a required number of LED units 10, each of which has a transparent cylindrical case 16 including a rounded head 14. The outer frame 30 is provided with downwardly extending legs 32 at the opposite ends and at suitable intermediate positions, each leg 32 having a locking projection 34 at the lower end thereof for locking engagement in a mounting hole 37 which is formed in a circuit board 36. The outer frame 30 is further provided with partition walls 38 at suitable intervals, which partition walls 38 define a predetermined number of LED mounting sections extending successively in the longitudinal direction of the outer frame 30. These partition walls 38, however, may be omitted as shown particularly in FIG. 5 if desired. Provided in each section is a seat block 40 substantially of a rectangular parallelopiped shape which is flat on the upper and lower sides thereof. The lower side 42 of the seat block 40 is abutted on the circuit board 36 when the holder 18 is mounted thereon. The top surface 44 of the seat block 40 is located at a level slightly lower than the top surface of the outer frame 30. The opposite side faces 46 of the seat block 40 are fixed to the inner wall surfaces 48 of the outer frame 30, as by being integrally formed therewith. Formed in each seat block 40, and extending from the top to the bottom surface 42 thereon, are a pair of lead wire holes 50 for passing external lead wires 20 of an LED unit 10. The paired lead wire holes 50 are spaced from each other by the same distance as the external lead wires 20 of the LED unit 10, and have upper portions conically widened toward the upper surface of the seat block 40. Instead of a conical shape, these lead wire holes 50 may be in the form of an upwardly diverging pyramid as shown in FIG. 3.

The gripper arms 52 are each constituted by a vertically elongated strip having the opposite sides of its end portion extended toward and connected with inner side wall surfaces 48 of the outer frame 30 to form an integral structure with the latter. A pair of gripper arms 52 are erected confrontingly on the opposite sides of each seat block 40 and spaced from each other by a distance which is suitable for gripping the flange portion 12 of a LED unit 10 therebetween. Each gripper arm 52 is provided with a locking projection 60 on the inner side of its upper end portion, the locking projection 60 being formed by inwardly converging upper and lower inclined surfaces 58 and 56 and provided at such a height that it will be located at a slightly higher level than the flange portion 12 of the LED when the latter is placed on the top surface 44 of the seat block 40. Indicated at 70 are LED orienting projections which are provided on one side wall of the outer frame 30 for blocking insertion of an incorrectly oriented LED unit 10 by collision against an arcuate side 12C of the LED which should instead be positioned in the arcuate recess 71 on the other side of the outer frame. When a straight side 12S of a LED is faced toward the LED orienting projection 70, the flange portion 12 of the LED 10 can be fitted into position without collision against the projection 70. Elements 80 are switches.

Figure 6:
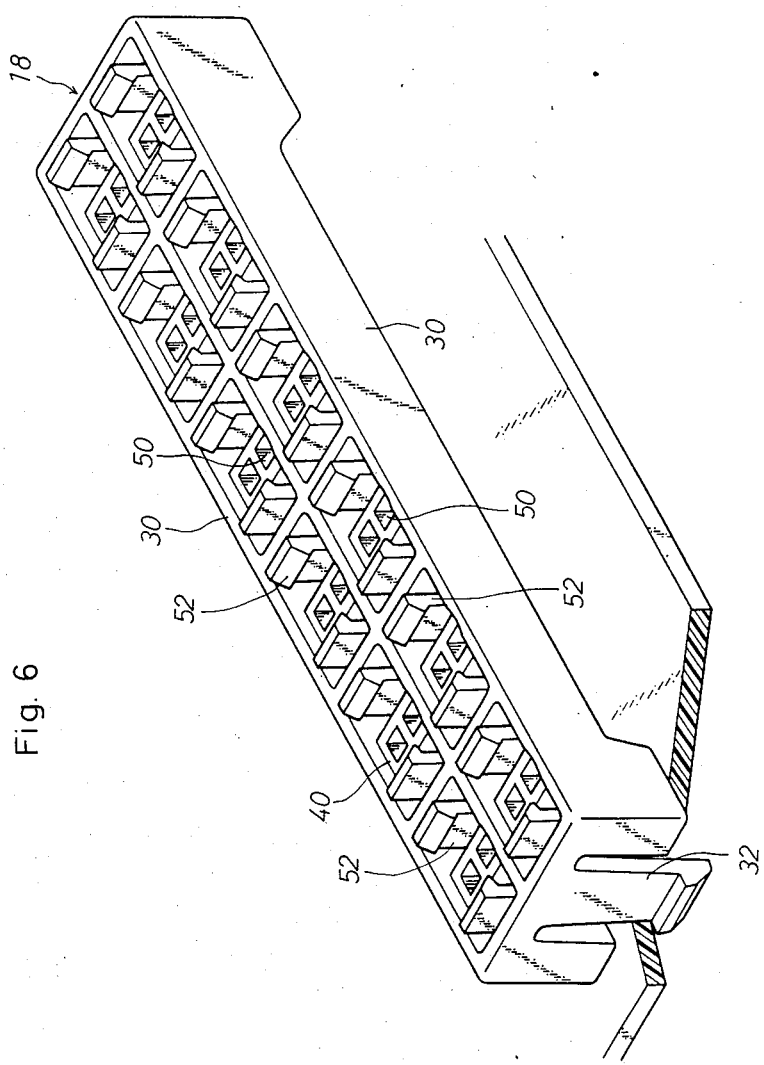
Figure 7:
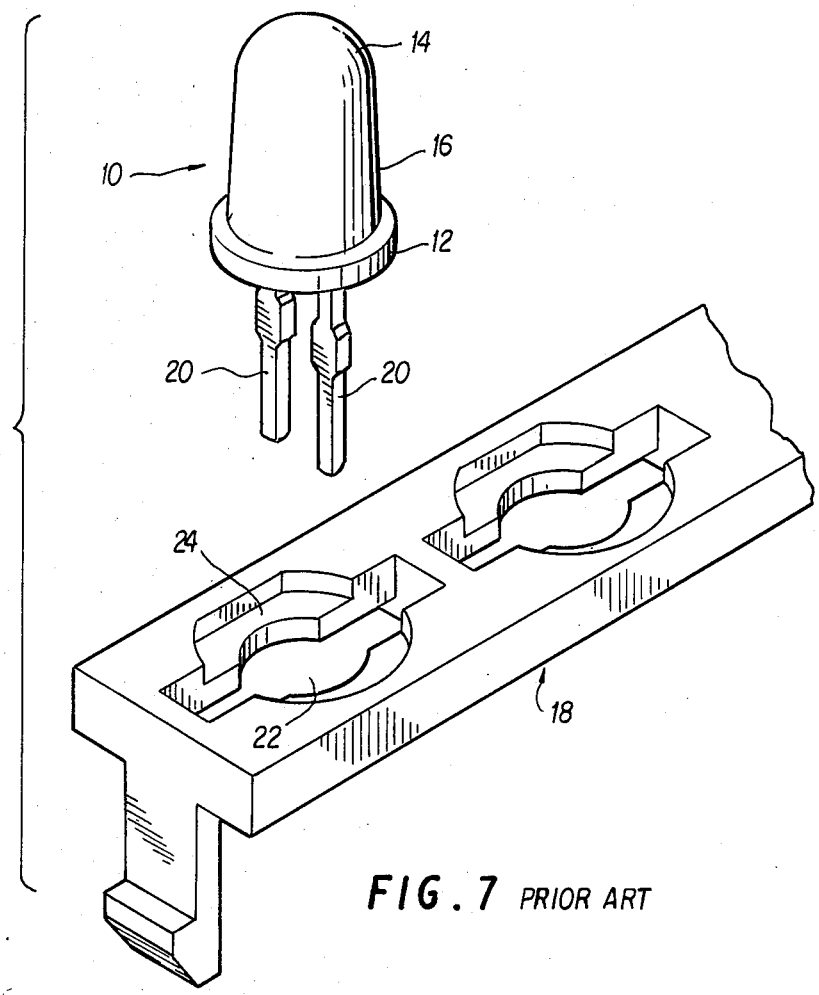
FIG. 7 is a perspective view of the prior art.

The above-described holder 18 of the invention is normally fixed on a circuit board 36 by fitting the legs 32 of the holder in predetermined mounting holes 37, stopping the locking projection 34 against the rear side of the circuit board 36. In the next place, after passing the external lead wires 20 of the LED 10 through the lead wire holes 50 in the seat block 40, the LED 10 is pushed downward, pushing apart the gripper arms 52 by pressing engagement of its flange portion 12 with the upper inclined surfaces 58 of the gripper arms 52. Since the gripper arms 52 are constituted by a narrow strip which are connected to the outer frame 30 at the respective base ends 54 and are therefore resiliently flexed in directions away from each other at this time, they permit the flange portion 12 of the LED 10 to ride over the locking projections 60 easily when the LED 10 is pushed into position on the top surface 44 of the seat block 40. In addition, as soon as the LED 10 is fit into position on the seat block 40, the gripper arms 52 which have been pushed apart by the flange portion 12 of the LED 10 tend to move inward, due to their resiliency securely gripping the LED 10 on the holder 18. In this embodiment, the locking projection 60 at the upper end of each gripper arm 52 is constituted by the inwardly converging lower and upper inclined surfaces 56 and 58, so that the flange portion 12 of the LED 10 is slid along the inclined surfaces as the LED 10 is pushed into position on the seat block 40, to ensure smooth mounting of the LED 10 on the holder. The fixation of the LED 10 on the seat block 40 can be confirmed by a click sound. Although the lead wire holes 50 in the seat block 40 have been shown as being widened in a conical shape in the respective upper portions in the foregoing embodiments, the same effects can be obtained by providing an upwardly diverging conical portion in an intermediate portion of each lead wire hole as in the second embodiment shown in FIG. 5. Further, the LED units 10 are mounted in a row in the foregoing embodiments, they may be arranged in double rows as in the third embodiment shown in FIG. 6 or in three or four rows, or alternatively in a square form if desired. The seat block 40 is preferred to be of any shape as long as it has flat surfaces on the upper and lower sides and permits provision of the lead wire holes.

What is claimed is:

1. A light emitting diode holder comprising:
   (a) a seat block for mounting a light emitting diode unit on an upper surface thereof;
   (b) a pair of lead wire holes formed through said seat block for passing lead wires of said light emitting diode unit and each having a widening sectional area in a direction toward said upper surface;
   (c) a pair of gripper arms erected on the opposite sides of said seat block;
   (d) a locking projection provided on a side of an upper end portion of each gripper arm facing another gripper arm of said pair of gripper arms for engagement with a flange portion of said light emitting diode unit;
   (e) an outer frame of an elongated box-like shape, said seat block and gripper arms being fixed within said outer frame;
   (f) leg portions downwardly extending from said outer frame; and
   (g) a second locking projection provided at a distal end of each leg portion for locking engagement in a circuit board,
   wherein said seat block is substantially in the form of a body with flat surfaces on upper and lower sides thereof, the lower flat surface being abutted on a circuit board when said holder is mounted thereon, and the upper flat surface being located at a slightly lower level than the top surface of said outer frame, and wherein said outer frame has an LED orienting projection on one side wall thereof.

2. The light emitting diode holder as claimed in claim 1 including partition walls for dividing said outer frame into a number of sections.

3. The light emitting diode holder as claimed in claim 1, wherein said seat block is substantially in the form of a rectangular parallelopiped.

4. The light emitting diode holder as claimed in claim 1, wherein lateral sides of said seat block are integrally connected to inner side surfaces of said outer frame.

5. The light emitting diode holder as claimed in claim 1, wherein said lead wire holes are formed in a shape comprising a pyramid or a cone.

6. The light emitting diode holder as claimed in claim 1, wherein said locking projection comprising a pair of converging inclined surfaces.

7. The light emitting diode holder as claimed in claim 1, wherein intermediate portions of said lead wire holdes are broadened.

8. The light emitting diode holder of claim 1 wherein said outer frame encloses blocks arranged side by side.

* * * * *